United States Patent
Vyssotski et al.

(10) Patent No.: US 6,650,074 B1
(45) Date of Patent: Nov. 18, 2003

(54) FAN SPEED CONTROLLER WITH CONDITIONED TACHOMETER SIGNAL

(75) Inventors: Nikolai Vyssotski, Elgin, TX (US); Christian L. Critz, Georgetown, TX (US)

(73) Assignee: Dell Products, L.P., Round Rock, TX (US)

(*) Notice: Subject to any disclaimer, the term of this patent is extended or adjusted under 35 U.S.C. 154(b) by 0 days.

(21) Appl. No.: 10/271,032

(22) Filed: Oct. 15, 2002

Related U.S. Application Data

(63) Continuation-in-part of application No. 10/157,294, filed on May 29, 2002.

(51) Int. Cl.[7] .................. H02K 23/00; H02P 1/18; H02P 3/08; H02P 5/06; H02P 5/28
(52) U.S. Cl. ............... 318/254; 318/138; 318/439; 318/599; 318/799; 318/811; 363/26; 363/41; 388/811; 388/819
(58) Field of Search .............. 318/254, 138, 318/439, 599, 799, 806, 808, 811; 363/26, 41, 47; 388/811, 819, 829, 831

(56) References Cited

U.S. PATENT DOCUMENTS

| | | | |
|---|---|---|---|
| 5,513,361 A | 4/1996 | Young | 395/750 |
| 5,625,269 A * | 4/1997 | Ikeda | 318/696 |
| 5,687,079 A | 11/1997 | Bauer et al. | 364/175 |
| 5,825,972 A * | 10/1998 | Brown | 388/811 |
| 5,848,282 A | 12/1998 | Kang | 395/750.05 |
| 5,881,298 A | 3/1999 | Cathey | 395/750.06 |
| 5,898,288 A * | 4/1999 | Rice et al. | 318/685 |
| 5,942,866 A * | 8/1999 | Hsieh | 318/268 |
| 6,008,603 A * | 12/1999 | Jones et al. | 318/254 |
| 6,054,823 A * | 4/2000 | Collings et al. | 318/439 |
| 6,188,189 B1 | 2/2001 | Blake | 318/471 |
| 6,259,172 B1 | 7/2001 | Lee | 307/125 |
| 6,285,146 B1 | 9/2001 | Harlan | 318/254 |

OTHER PUBLICATIONS

"Fan Speed Control is Cool !"; http://www.maxim-ic.com/appnotes.cfm/appnote_number/707; Feb. 2, 2001.*

* cited by examiner

Primary Examiner—Robert E. Nappi
Assistant Examiner—Edgardo San Martin
(74) Attorney, Agent, or Firm—Baker Botts L.L.P.

(57) ABSTRACT

The speed of a fan motor is controlled by varying a DC voltage to the fan motor. A series pass transistor is used to vary the DC voltage to the fan motor. A power management controller sets the fan motor speed by outputting pulses to a pulse-to-DC voltage converter that changes the pulses to a proportional DC control voltage for controlling the series pass transistor. A tachometer output amplifier circuit is used to remove DC components and amplify to useful logic levels a low level tachometer output signal from the fan motor. The amplified tachometer signal is used by the power management controller in controlling the rotational speed of the fan motor.

33 Claims, 3 Drawing Sheets

FAN SPEED CONTROLLER WITH CONDITIONED TACHOMETER SIGNAL

RELATED PATENT APPLICATION

This application is a continuation-in-part application of commonly owned U.S. patent application Ser. No. 10/157,294, entitled "A Circuit for Regulating a Power Supply Voltage," by Nikolai V. Vyssotski and Christian L. Critz, filed May 29, 2002, and is hereby incorporated by reference herein for all purposes.

BACKGROUND OF THE INVENTION TECHNOLOGY

1. Field of the Invention

The present application is related to information handling systems, and more specifically, to information handling systems having variable speed cooling fans.

2. Description of the Related Art

Information handling systems play a vital role in modern society. An information handling system generally processes, compiles, stores, and/or communicates information or data for business, personal or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for these systems to be general or configured for a specific user or specific use such as financial transaction processing, airline reservations, enterprise data storage, or global communications. In addition, information-handling systems may include a variety of hardware and software components that may be configured to process, store, and communicate information and may include one or more computer systems, data storage systems, and networking systems.

A computer system, which is one common type of information handling system, may be designed to give independent computing power to one or a plurality of users. Computer systems may be found in many forms including, for example, mainframes, minicomputers, workstations, servers, clients, personal computers, Internet terminals, notebooks, personal digital assistants, and embedded systems.

The computer system may include microprocessors that require active cooling to operate in a thermal environment recommended by its manufacturer. To achieve adequate cooling, various thermal solutions are used with fans being integral parts of such solutions. Ideally, maximum airflow (fan fully on) allows for best cooling results, however, acoustical noise from the fan and fan power consumption are also at maximum. Therefore, it is desirable to have the ability to gradually vary fan speed in a thermal solution. However, robust implementation of a variable speed fan controller is hard to achieve due to different fan manufacturers' requirements for supply voltage stability and available signal quality of fan tachometer (rotational speed) output (especially at low rotational speeds).

The noise and power usage problems have been addressed by using pulse width modulated (PWM) signals to periodically interrupt supply voltage to the fan. This provided desirable results regarding fan noise and power consumption, but in some fans it caused premature failures and corruption of logic generating the tachometer output signals from the fan.

Another way that the noise and excess power problems have been addressed was to use a fully integrated fan controller integrated circuit (IC) having an SMB or I$^2$C compatible interface. This allowed for seamless fan control, however, if the fan controller IC implemented direct PWM control, then the same fan reliability issues were still present. A significant drawback of using the fan controller IC was cost.

Linear regulators have been used with power management controllers by setting the fan voltage based on binary states of one or more control signals (essentially, a crude DAC is used as a reference for linear regulator). However, a drawback was requiring dedicated binary outputs and only course resolution for fan speed control (e.g., most often there are only three fan speed settings: OFF, LOW, HIGH).

Heretofore, low fan speeds could not be utilized below a certain voltage because the fan digital circuits for producing a rotational speed tachometer output were failing to produce acceptable logical levels due to the low supply voltage to the fan motor. In other words, the supply voltage would be sufficient to run the fan at a low speed but the tachometer output became non-functional at low speeds corresponding to the low voltages.

FIG. 1 illustrates relevant components of an information handling system 10 having a central processing unit (CPU) 12 coupled to a memory 14 that stores instructions executable by the CPU 12. Information handling system 10 includes an electric fan motor 16 that turns a fan blade (not shown) for cooling the CPU 12 during operation thereof. CPUs 12 require active cooling to operate in a thermal environmental envelope recommended by the processor manufacturer. Fans are the preferred means for maintaining CPU temperature within the recommended thermal envelope. Ideally, the maximum airflow (fan is fully on) provides the best cooling results. However, it is desirable to be able to gradually vary the fan speed according to the cooling needs in order to save power. Additionally, reducing fan speed reduces acoustic noise produced by the cooling fan. The fan speed can be varied by varying the voltage provided to the power input node of the electric fan motor 16.

Fan speed depends on the magnitude of voltage provided to the fan motor 16. Information handling system 10 includes a circuit for regulating the power provided to the fan motor 16. The circuit includes a power management circuit (PMC) 18 and power field effect transistor (FET) 20 coupled between the electric motor 16 and PMC 18. More particularly, the output of the PMC 18 is coupled to a gate-input node of the FET 20. The source node of the FET 20 is coupled to a first power supply having a voltage VCC1, while a drain node of the FET 20 is coupled to a power input node of the fan motor 16.

The PMC 18 generates a square wave signal, the duty cycle of which depends upon a control signal provided to the PMC 18. FIG. 2 illustrates an exemplary square wave generated by the PMC 18. The square wave shown in FIG. 2 varies between VCC2, the voltage of a second power supply coupled to the PMC 18 in FIG. 1, and ground. VCC2 may be distinct from VCC1, or from the same power supply. The first power supply is capable of providing high current power to the fan motor 16 when compared to the current that is provided by the second power supply. As noted above, the duty cycle depends upon the control signal provided to the PMC 18. The period of the square wave shown in FIG. 2 remains constant, notwithstanding a change in the duty cycle in response to a change in the control signal provided to the PMC 18.

The square wave signal generated by the PMC 18 is coupled to the gate-input node of the power FET 20. When the voltage of the square wave signal is at VCC1, the FET 20 activates (becomes a low resistance), thereby coupling the first power supply (VCC1) to the power-input node of fan motor 16. In response, a shaft (not shown) of motor 16 rotates thereby turning a fan blade (not shown) which in turn produces airflow over the CPU 12. When the voltage of the square wave signal provided to the input gate of FET 20 is at or near ground, the FET 20 turns off, thereby disconnecting the first power supply from the input node of the fan motor 16. In response, the rotational speed of the motor shaft begins to slow and may even stop until the FET 20 is again activated by the square wave being at VCC1.

The rotational speed of the fan motor's shaft depends upon the duty cycle of the square wave provided to the gate input of the FET 20. The higher the duty cycle results in the higher the average rotational speed of the shaft. To obtain the highest average rotational speed, the duty cycle of the square wave would be 100%. With a 0% duty cycle, no power is provided to the fan motor 16, and the shaft does not rotate. For duty cycles between 0 and 100%, the average rotational speed of the fan motor's shaft varies accordingly.

The constant coupling and decoupling of the first power supply to the power input node of fan motor 16, according to the square wave provided to the gate input node of FET 20, stresses the fan motor 16 such that it may eventually and prematurely fail. Additionally, the constant coupling and decoupling of the first power supply to the fan motor 16 creates noise which tends to corrupts logic within the fan motor 16 that generates a tachometer signal representing the rotational speed of the shaft of fan motor 16. This tachometer signal is used in controlling the fan motor 16 at a desired rotational speed. Inaccurate tachometer signals will create undesirable and unreliable control of the fan motor 16 when running at low speeds.

Therefore, a problem exists and a solution is desired for improved fan reliability and control in an information handling system.

SUMMARY OF THE INVENTION

The present invention remedies the shortcomings of the prior art by providing an apparatus, system, and method for improving fan reliability and control in an information handling system.

The present invention includes benefits of pulse width modulation (PWM) and linear voltage regulation techniques while still keeping the cost down since no dedicated fan controller integrated circuit (IC) is required and the fan controller may be implemented with low cost components, discrete and/or integrated. The variable speed fan controller can drive fans to much lower speeds than other known fan controllers by signal conditioning the tachometer output, according to the present invention.

In an exemplary embodiment of the invention, an existing power management controller (PMC) may be used to generate a PWM output to control fan speed based upon the tachometer output signal from the fan. The PWM control signal is fed into a first order resistor-capacitor (RC) low pass filter that is adapted to output DC voltages proportional to the duty cycle of PWM signal input, e.g., Vout=D*Vcc, where D is the duty cycle [0-1] and Vcc is the supply voltage for the power management controller. The DC output of the low-pass filter may be scaled to match the maximum output voltage level of the PMC (100% duty cycle) and maximum supply voltage allowed to the fan (maximum speed). This scaled voltage is then used as a control signal to a linear voltage regulator, e.g., a series pass transistor, to supply output voltage at high current to the fan that is proportional to the duty cycle of PMC output. Thus, the supply voltage to the fan may be gradually varied from 0 to the maximum power supply voltage value with a single wire interface from the PMC and low cost small sized components.

When the fan supply voltage is brought to a value necessary to obtain the minimum possible fan speed without allowing it to stall, in some fans the tachometer output signal quality will significantly deteriorate and the tachometer output signal will not be recognizable by conventional PMC systems. Under low supply voltage and rotational speed conditions, the signal amplitude on the fan tachometer output may be as low as 400–500 mV and have a gradually increasing DC offset. In the preferred exemplary embodiment of the invention, signal conditioning circuits remove the DC component and amplify this tachometer output signal so that it may be easily recognized by conventional digital logic in the PMC.

In an information handling system, an embodiment of the present invention is characterized as comprising: a microprocessor for executing instructions stored in a memory coupled thereto; a fan for cooling said microprocessor during operation thereof, said fan comprising a fan motor and a fan blade coupled to a shaft of said fan motor, wherein the shaft rotation speed is dependent upon a direct current (DC) voltage level applied to said fan motor, and said fan motor has a tachometer output for indicating the shaft rotation speed; a linear voltage regulator coupled between said fan motor and a first DC power source, said linear voltage regulator controlling the DC voltage level applied to said fan motor; a power management controller having a speed control pulse output and a tachometer pulse input; a pulse-to-DC voltage converter, said pulse-to-DC voltage converter coupled between the speed control pulse output of said power management controller and a control input of said linear voltage regulator; and a tachometer pulse amplifier coupled between the tachometer output of said fan motor and the tachometer pulse input of said power management controller, whereby said power management controller controls said fan motor shaft speed.

Another embodiment of the present invention is characterized as an apparatus for controlling fan speed, comprising: a fan motor having a shaft speed dependent upon a direct current (DC) voltage level applied to said fan motor and a tachometer output; a linear voltage regulator coupled between said fan motor and a first DC power source, said linear voltage regulator controlling the DC voltage level applied to said fan motor; a power management controller having a speed control pulse output and a tachometer pulse input; a pulse-to-DC voltage converter, said pulse-to-DC voltage converter coupled between the speed control pulse output of said power management controller and a control input of said linear voltage regulator; and a tachometer pulse amplifier coupled between the tachometer output of said fan motor and the tachometer pulse input of said power management controller, whereby said power management controller controls said fan motor shaft speed.

Yet another embodiment of the present invention is characterized as a method for controlling a fan motor having a shaft rotation speed dependent upon a direct current (DC) voltage level applied to said fan motor and a tachometer output, said method comprising the steps of: generating a plurality of speed determining pulses, wherein a characteristic of the plurality of speed determining pulses represents a desired fan motor shaft rotation speed; converting the plurality of speed determining pulses into a DC voltage representative of the desired fan motor shaft rotation speed; applying the DC voltage to the fan motor; and determining the shaft rotation speed of the fan motor by measuring a plurality of shaft rotation pulses from the fan motor.

A technical advantage of the present invention is a low cost solution using an existing PMC. Another technical advantage is the ability to interface with most types of fans. Still another technical advantage is gradual and continuous variation of fan speed (PWM to linear conversion). Another technical advantage is a wide range of fan speeds available because of tachometer signal conditioning. Another technical advantage is the ability to vary fan speeds gradually in an analog manner to minimize acoustic noise and save power. Another advantage is reduced cost for parts and labor to implement embodiments of the invention into information handling systems. Still other advantages are support for fans from different vendors and flexibility in using an existing PMC in the information handling system without the need for a special integrated circuit fan controller.

BRIEF DESCRIPTION OF THE DRAWINGS

A more complete understanding of the present disclosure and advantages thereof may be acquired by referring to the following description taken in conjunction with the accompanying drawings wherein.

Figure 1:
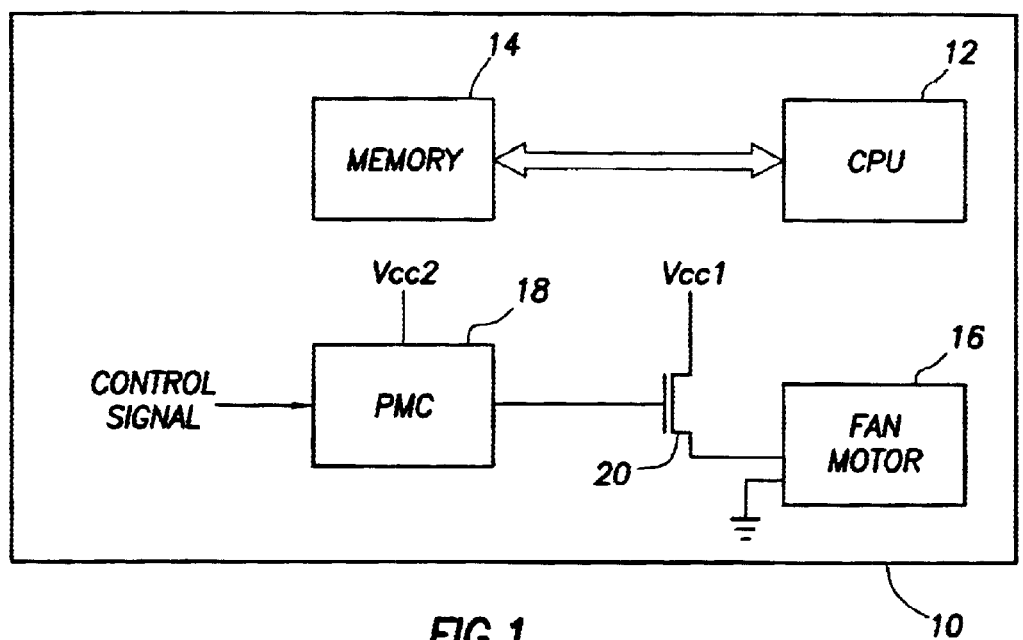
FIG. 1 is a schematic block diagram of prior art information handling system with a power management controller fan interface.
Figure 2:
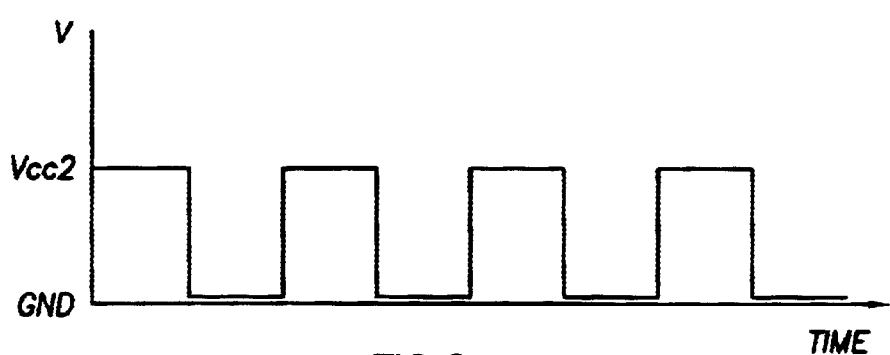
FIG. 2 illustrates an exemplary square wave signal generated by the power management controller of FIG. 1.

The present invention may be susceptible to various modifications and alternative forms. Specific exemplary embodiments thereof are shown by way of example in the drawing and are described herein in detail. It should be understood, however, that the description set forth herein of specific embodiments is not intended to limit the present invention to the particular forms disclosed. Rather, all modifications, alternatives, and equivalents falling within the spirit and scope of the invention as defined by the appended claims are intended to be covered.

DETAILED DESCRIPTION OF SPECIFIC EMBODIMENTS

The present invention is directed to fan speed control with a conditioned tachometer signal in an information handling system. Use of a standard power management control circuit and inexpensive components enables continuous fan speed control and monitoring with a minimum of input-output ports, and these ports may be standard digital ports.

Disclosed is a circuit for controlling a DC voltage in response to receiving a square wave signal having a varying duty cycle, e.g., pulse width modulation (PWM). Control of the magnitude of the DC voltage varies according to the duty cycle of the received square wave signal. The DC voltage may be provided to an input node of a electrical or electronic device. For purposes of explanation, the present invention will be described with reference to a circuit for providing a DC voltage to a power-input node of a fan motor contained within an information handling system, it being understood that the present invention should not be limited thereto.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to the drawings, the details of exemplary embodiments of the present invention are schematically illustrated. Like elements in the drawings will be represented by like numbers, and similar elements will be represented by like numbers with a different lower case letter suffix.

Figure 3:
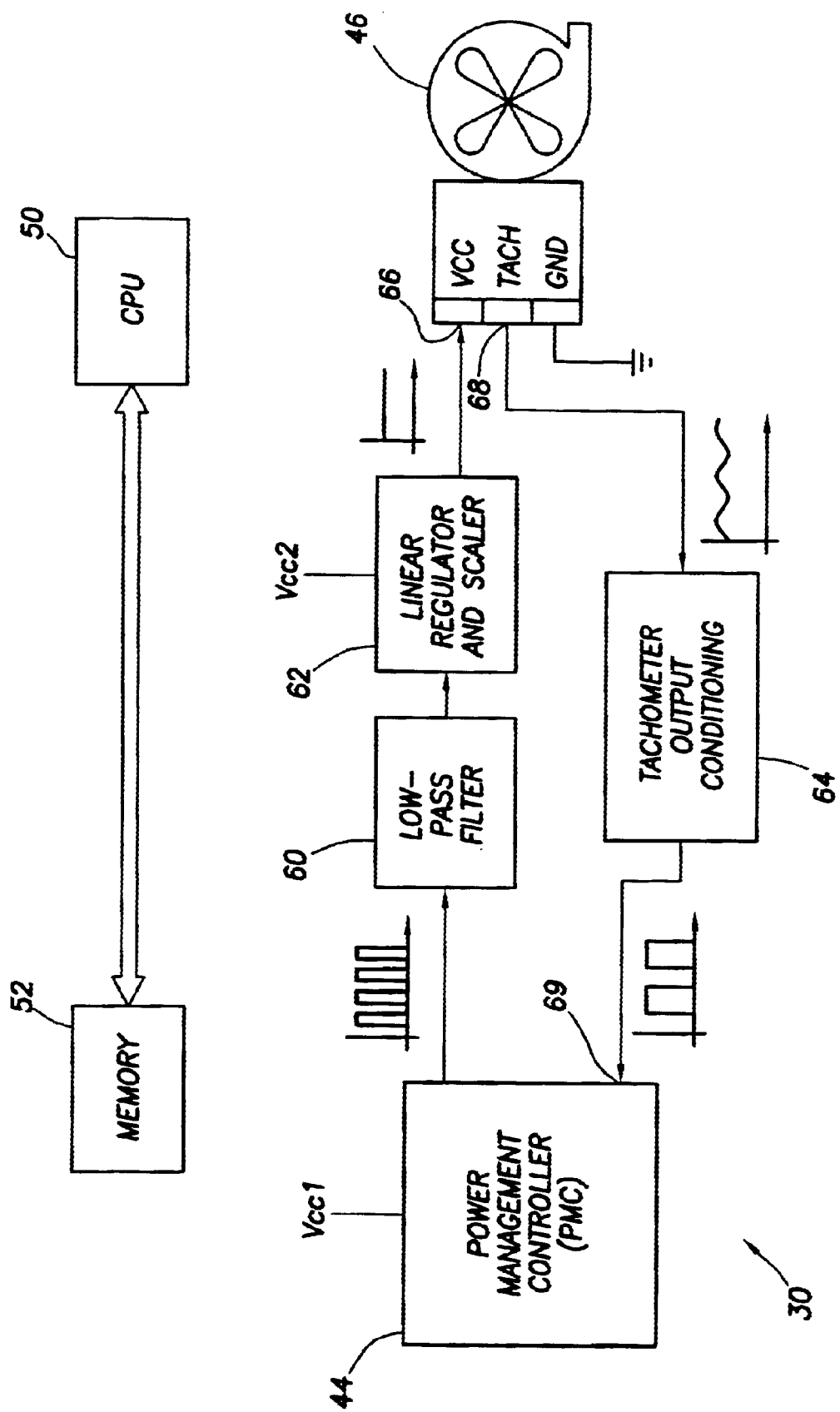
FIG. 3 is a schematic block diagram of an exemplary embodiment of a fan speed controller with conditioned tachometer signal, as utilized with an information handling system.

Referring now to FIG. 3, depicted is a schematic block diagram of an exemplary embodiment of a fan speed controller with conditioned tachometer signal, as utilized in an information handling system. The fan speed controller with conditioned tachometer signal in an information handling system is generally represented by the numeral 30 and comprises a power management controller (PMC) 44, a low pass filter 60, a linear regulator 62, and tachometer output signal conditioning (tachometer conditioning) 64 as utilized in the information handling system.

For illustrative purposes and as a mere representation of an information handling system, a central processing unit (CPU) 50 and a memory 52 are shown in FIG. 3 One of ordinary skill in the art of information handling systems would know and appreciate the various other parts required for the information handling system. Also of these parts are not represented herein, but the present invention is not limited to only one embodiment of an information handling system, rather, it is contemplated and with the scope of the present invention that any form of electronics systems may benefit the invention disclosed herein.

The linear regulator output is coupled to a power-input node 66 of DC fan motor 46. Fan motor 46 includes a shaft that rotates fan blades (not shown). The rotating fan blades provide a stream of air for cooling components (not shown), e.g., central processing unit (CPU), within the information handling system. The volume of air measured in a given period of time that flows over the components in the information handling system depends upon the average rotational speed of the fan motor shaft during that given period of time. The average rotational speed of the fan motor shaft during the given period of time depends upon the average magnitude of voltage provided to the power-input node 66.

Figure 4:
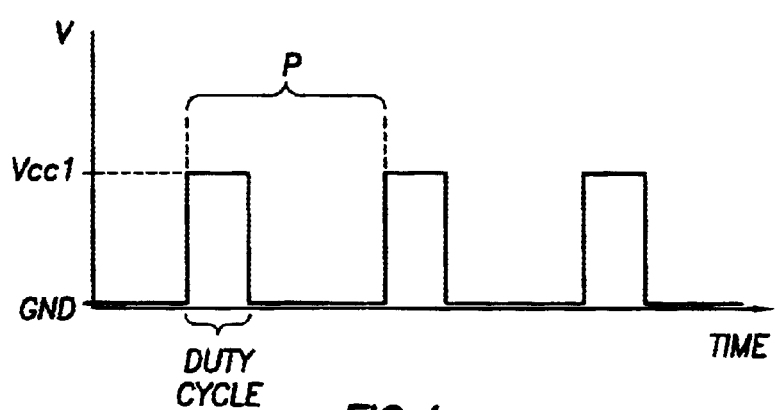
FIG. 4 is a graphical depiction of an exemplary square wave signal generated by the power management controller of FIG. 3.

The PMC 44 generates a square wave signal that is provided to an input of the low pass filter 60. FIG. 4 illustrates an exemplary square wave provided by the PMC 44 to the input of the low pass filter 60. The voltage of the square wave varies in magnitude from ground to VCC1, the voltage of a first power supply coupled to the PMC 44. The duty cycle for the square wave shown in FIG. 4 is controlled by a control signal provided to the PMC 44. The duty cycle can range from 0% to 100% of the period P of the square wave signal. The duty cycle is defined as 100% multiplied by W/P where W is the amount of time the square wave is on during each period P of the square wave. The DC signal output produced by low pass filter 60 varies linearly from ground, when the duty cycle of the square wave is 0%, to VCC1 when the duty cycle of the square wave is 100%. Thus, the magnitude of the DC signal output of low pass filter 60 is proportional to the duty cycle of the square wave provided by PMC 44. For example, the DC signal output of low pass filter 60 will have a magnitude of ½ * VCC1 when the duty cycle of the square wave is 50%. For illustrative purposes, the square wave of FIG. 4 is shown with approximately a 33% duty cycle. The PMC may be adapted for temperature information input of the components to be cooled by the fan by using a temperature measurement sensor (not shown).

Referring back to FIG. 3, the low pass filter 60 is coupled to the PMC 44 and receives the square wave, e.g., PWM, signal generated by the PMC 44. The low pass filter 60 smoothes the pulses of the square wave signal to a mostly direct current (DC) voltage proportional to the duty cycle of the signal. The output voltage of the low pass filter 60 may also have a few low frequency components. However, the voltage magnitude of any low frequency components (if any) of the output of the low pass filter 60 will be substantially lower when compared to the voltage magnitude of the DC component. For purposes of explanation, it will be presumed that the signal generated by low pass filter 60 will not include any non-zero frequency components.

In one exemplary embodiment of the invention, the DC signal generated by the low pass filter 60 is scaled or divided before being applied to the linear regulator 62 input. The linear regulator 62 controls the voltage provided to the power-input node 66 of the fan motor 46 in accordance with this scaled DC signal. VCC2, as noted above, may be different than VCC1 in magnitude. For purposes of explanation it will be presumed that VCC2 is greater than VCC1. The magnitude of the voltage provided to the power-input node 66 of the fan motor 46 depends upon the magnitude of the scaled DC signal. More particularly, the magnitude of the voltage provided to the power-input node 66 of fan motor 46 varies linearly from ground, when the scaled DC signal is ground, to VCC2, when the scaled DC signal is at its maximum value. Importantly, the voltage provided to the fan motor 46 varies with the duty cycle of the square wave generated by the PMC 44. Thus, the magnitude of the voltage provided to the fan motor 46 varies linearly from ground when the duty cycle is 0% to VCC2 when the duty cycle is 100%.

Even if the output of the low pass filter 60 includes low frequency components, the output of the low pass filter 60 will not vary between ground and a positive voltage as in the prior art (FIG. 1) and thus will not cause the fan motor 46 to eventually and prematurely fail as a result of being turned on and off at a high frequency rate. For purposes of explanation, it will be presumed that the output of the low pass filter 60 will include no non-zero frequency voltage components.

In another exemplary embodiment, the voltage output of linear regulator 62 varies between ground and VCC2, the voltage of a second power supply provided to linear regulator 62. VCC2 may be greater in magnitude than VCC1, or VCC1 and VCC2 may be equal in magnitude. Indeed, linear regulator 62 and the PMC 44 may be coupled to the same power supply. However, the fan motor 46 generally requires greater current than that needed to drive the digital logic of the PMC 44. For purposes of explanation, the PMC 44 and the linear regulator 62 are coupled to the first and second power supplies, respectively, as shown, with VCC2 greater than VCC1. Additionally, the second power supply provides more current to the linear regulator 62 when compared to the first power supply.

Fan motor 46, receives the DC voltage from the linear regulator 62 at power-input node 66. In response, the fan motor 46 rotates its shaft. The speed at which fan motor 46 rotates its shaft depends upon the magnitude of the voltage at power-input node 66. The higher the voltage, the faster the shaft of fan motor 46 turns.

When the shaft of the fan motor 46 rotates, pulses from the tachometer output of the fan motor 46 are representative of the rotational speed of the shaft, e.g., pulses per second, no pulses—no rotation of the shaft. Output amplitude from the tachometer sensor/electronics depends on the voltage at the power-input node 66. When this voltage is low, e.g., fan motor 46 running at slow speeds, the tachometer output is also low, e.g., small amplitude. The tachometer output conditioning 64 receives pulses from the tachometer having a wide voltage amplitude range, and is adapted to amplify the small amplitude (weak) tachometer pulses to levels usable, e.g., logic voltage levels, by the PMC 44. The tachometer output conditioning 64 is coupled between the fan motor 46 tachometer output and the tachometer input of the PMC 44. The tachometer conditioning 64 enables the PMC 44 to operate and monitor the fan motor 46 at much lower speeds (to the point of shaft stall) since the tachometer signal to the PMC 44 is no longer dependent upon the voltage at the fan motor 46.

Figure 5:
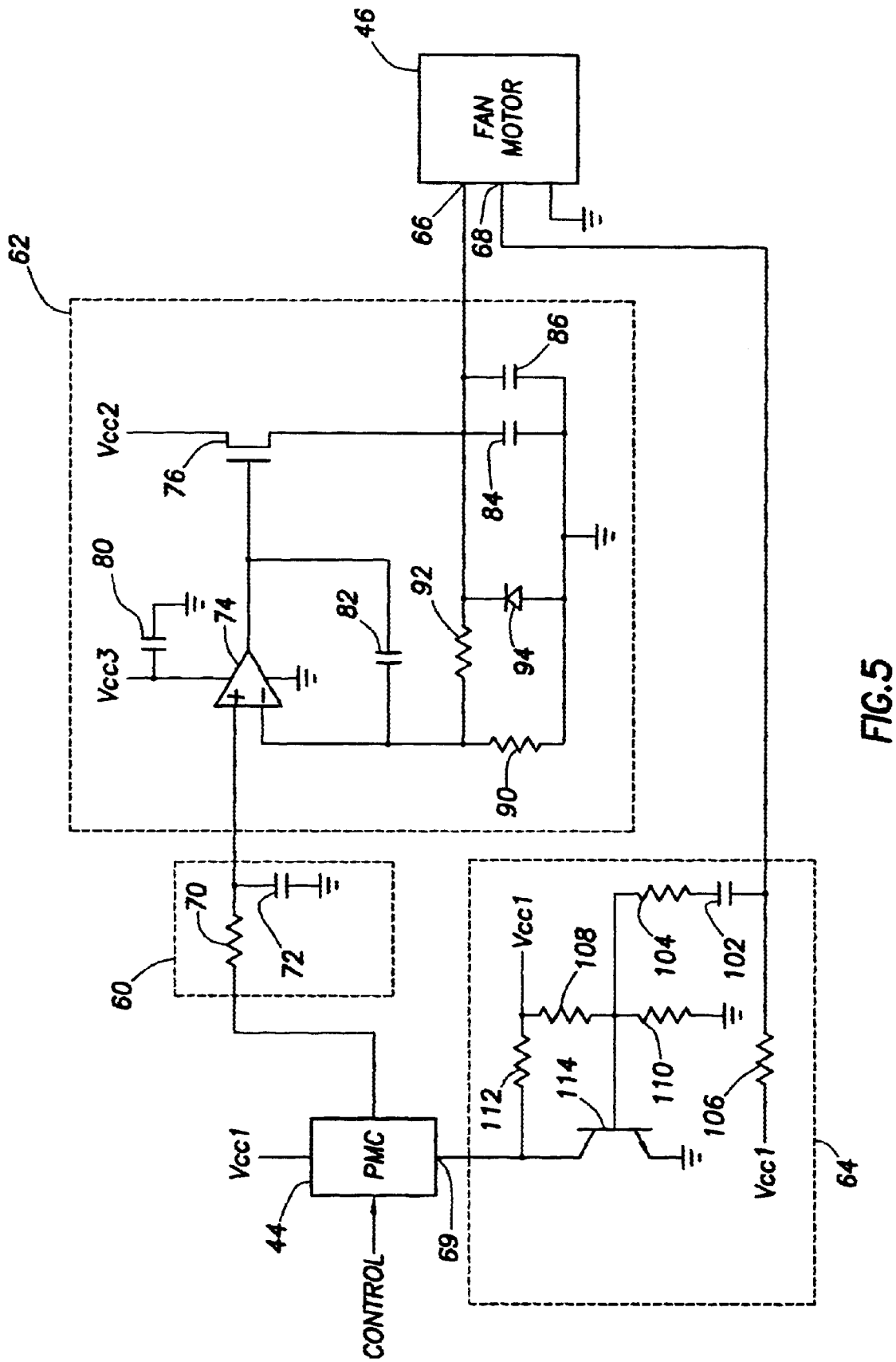
FIG. 5 is a schematic diagram illustrating relevant components of the exemplary embodiment depicted in FIG. 3.

Referring now to FIG. 5, depicted is a schematic diagram illustrating relevant components of the exemplary embodiment depicted in FIG. 3. Low pass filter 60 may comprise a resistor 70 coupled to a capacitor 72. As illustrated in FIG. 5, the resistor 70 is coupled between input and output nodes of low pass filter 60. It is noted that the input node of low pass filter 60 is coupled to the output node of PMC 44. Capacitor 72 is coupled between the output node of low pass filter 60 and ground. The input node of low pass filter 60 receives the square wave signal generated by the PMC 44. In response, low pass filter 60 provides the DC signal at its output node. Again, the voltage magnitude of the DC signal provided by low pass filter 60 is dependent upon the duty cycle of the square wave signal input.

FIG. 5 also illustrates relevant components and an exemplary embodiment of the linear regulator 62. More particularly, the linear regulator 62 is shown to include an operational amplifier 74 coupled between the output of low pass filter 60 and a power transistor 76. For purposes of explanation, power transistor 76 may be a power field effect transistor (FET) and the like, it being understood that the present invention should not be limited thereto. For example, power transistor 76 could take form as a bipolar junction transistor (BJT). A non-inverting input node of the amplifier 74 is coupled to the output of low pass filter 60, while the output of amplifier 74 is coupled to the gate input node of the power transistor 76. The linear regulator 62 also includes capacitors 80–86, resistors 90 and 92, and diode 94. Amplifier 74 may be coupled to a third power supply having a voltage VCC3 which, in one embodiment, is greater in magnitude than the voltage VCC2 of the second power supply. Capacitor 80 is coupled between the third power supply and ground. Capacitor 82 is coupled between the output node of amplifier 74 and the inverting input of amplifier 74. The source of the power transistor 76 is coupled to the second power supply while the drain (or collector) of the power transistor 76 is coupled to the power-input node 66 of fan motor 46. Additionally, capacitors 84 and 86 (which could be combined into a single capacitor) along with diode 94 are coupled in parallel to each other and between the input node of fan motor 46 and ground. Resistor 92 is coupled between the inverting input node of amplifier 74 and the input node of fan motor 46, while resistor 90 is coupled between the inverting input of amplifier 74 and ground.

Amplifier 74 operating in conjunction with one or more of components 80–94, generates the scaled DC signal mentioned above. This scaled DC signal is provided to the gate (base) input node of the power transistor 76. The power transistor 76 conducts current to the power-input node 66 of fan motor 46 when active. The voltage at which current is provided to the fan motor 46 depends upon the magnitude of the scaled DC signal provided to the gate input node of the power transistor 76. More particularly, the voltage provided to fan motor 46 varies linearly from ground when the scaled DC voltage at the output of amplifier 74 is ground, to VCC2 when the voltage at the output at amplifier 74 is at a threshold voltage below VCC1.

In an alternative embodiment where VCC1 is equal to VCC2, the low pass filter 60 shown in FIG. 5 may be coupled directly between PMC 44 and power transistor 76 without the voltage scale circuitry.

Also depicted in FIG. 5 is an exemplary embodiment of a circuit for the tachometer conditioning 64. The circuit for the tachometer conditioning 64 may comprise capacitor 102, resistors 104–112 and transistor 114. The capacitor 102 and resistor 104 are connected in series between the tachometer output 68 and the transistor 114 base. The capacitor 102 blocks any DC component on the tachometer output 68 and the resistor 104 in combination with the capacitor 102 may be used to shape the pulses received from the tachometer output 68. Resistors 106 and 112 are pull-up resistors to VCC1 and the resistors 108 and 110 are biasing resistors for the transistor 114. The transistor 114 output is coupled to the tachometer input 69 of the PMC 44. The transistor 114 has gain and can amplify the low amplitude level pulses from the tachometer output 68 to logic levels (high and low) sufficient to ensure reliable operation with the PMC 44.

The invention, therefore, is well adapted to carry out the objects and to attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An information handling system, comprising:
    a microprocessor for executing instructions stored in a memory coupled thereto;
    a fan for cooling said microprocessor during operation thereof, said fan comprising a fan motor and a fan blade coupled to a shaft of said fan motor, wherein the shaft rotation speed is proportionate to a direct current (DC) voltage level applied to said fan motor, and said fan motor has a tachometer output for indicating the shaft rotation speed;
    a voltage regulator coupled between said fan motor and a first DC power source, said voltage regulator controlling the DC voltage level applied to said fan motor, wherein the DC voltage level applied to said fan motor can be any voltage from about ground to about the first DC power source voltage;
    a power management controller having a speed control pulse output and a tachometer pulse input;
    a pulse-to-DC voltage converter, said pulse-to-DC voltage converter coupled between the speed control pulse output of said power management controller and a control input of said voltage regulator; and
    a tachometer pulse amplifier coupled between the tachometer output of said fan motor and the tachometer pulse input of said power management controller, whereby said power management controller controls said fan motor shaft speed.

2. The information handling system of claim 1, wherein said voltage regulator comprises a power transistor.

3. The information handling system of claim 2, wherein said power transistor is a field effect transistor.

4. The information handling system of claim 2, wherein said power transistor is a bipolar junction transistor.

5. The information handling system of claim 2, wherein said voltage regulator further comprises an operational amplifier coupled to the power transistor.

6. The information handling system of claim 1, wherein said pulse-to-DC voltage converter is a low pass filter.

7. The information handling system of claim 6, wherein the low pass filter comprises at least one resistor and at least one capacitor.

8. The information handling system of claim 7, wherein the at least one resistor is coupled between input and output nodes, and the at least one capacitor is coupled between the output node and a ground node, whereby the input node receives square wave signals from the speed control pulse output of said power management controller, and the output node produces a DC control signal to the control input of said voltage regulator.

9. The information handling system of claim 1, further comprising a voltage scaling circuit coupled between said pulse-to-DC voltage converter and the control input of said voltage regulator.

10. The information handling system of claim 1, wherein said power management controller is coupled to a second power source.

11. The information handling system of claim 10, wherein said pulse-to-DC voltage converter is coupled to a third power source.

12. The information handling system of claim 11, wherein the first DC voltage source has a higher current rating than the second voltage source.

13. The information handling system of claim 11, wherein the first DC voltage source has a higher current rating than the third voltage source.

14. The information handling system of claim 11, wherein the first DC voltage source is at a higher voltage than the second voltage source.

15. The information handling system of claim 11, wherein the first DC voltage source is at a higher voltage than the third voltage source.

16. The information handling system of claim 11, wherein the first DC voltage source, the second voltage source and the third voltage source are at approximately the same voltage.

17. The information handling system of claim 16, wherein the first DC voltage source, the second voltage source and the third voltage source are one common voltage source.

18. An apparatus for controlling fan speed, comprising:
   a fan motor having a shaft speed proportionate to a direct current (DC) voltage level applied to said fan motor and a tachometer output;
   a voltage regulator coupled between said fan motor and a first DC power source, said voltage regulator controlling the DC voltage level applied to said fan motor, wherein the DC voltage level can be any voltage from about ground to about the first DC power source voltage;
   a power management controller having a speed control pulse output and a tachometer pulse input;
   a pulse-to-DC voltage converter, said pulse-to-DC voltage converter coupled between the speed control pulse output of said power management controller and a control input of said voltage regulator; and
   a tachometer pulse amplifier coupled between the tachometer output of said fan motor and the tachometer pulse input of said power management controller, whereby said power management controller controls said fan motor shaft speed.

19. The apparatus of claim 18, wherein said voltage regulator comprises a power transistor.

20. The apparatus of claim 19, wherein said power transistor is a field effect transistor.

21. The apparatus of claim 19, wherein said power transistor is a bipolar junction transistor.

22. The apparatus of claim 19, wherein said voltage regulator further comprises an operational amplifier coupled to the power transistor.

23. The apparatus of claim 18, wherein said pulse-to-DC voltage converter is a low pass filter.

24. The apparatus of claim 23, wherein the low pass filter comprises at least one resistor and at least one capacitor.

25. The apparatus of claim 24, wherein the at least one resistor is coupled between input and output nodes, and the at least one capacitor is coupled between the output node and a ground node, whereby the input node receives square wave signals from the speed control pulse output of said power management controller, and the output node produces a DC control signal to the control input of said voltage regulator.

26. The apparatus of claim 18, further comprising a voltage scaling circuit coupled between said pulse-to-DC voltage converter and the control input of said voltage regulator.

27. A method for controlling a fan motor having a shaft rotation speed dependent upon a direct current (DC) voltage level applied to said fan motor and a tachometer output, said method comprising the steps of:
   generating a plurality of speed determining pulses, wherein a characteristic of the plurality of speed determining pulses represents a desired fan motor shaft rotation speed;
   converting the plurality of speed determining pulses into a DC voltage proportionate to the desired fan motor shaft rotation speed, wherein the DC voltage can be any voltage from about ground to a maximum voltage level;
   applying the DC voltage to the fan motor; and
   determining the shaft rotation speed of the fan motor by measuring a plurality of shaft rotation pulses from the fan motor.

28. The method of claim 27, where the step of generating a plurality of speed determining pulses is done with a power management controller.

29. The method of claim 28, where the power management controller uses pulse width modulation for the plurality of speed determining pulses.

30. The method of claim 27, where the step of converting the plurality of speed determining pulses into a DC voltage is done with a pulse-to-DC voltage converter.

31. The method of claim 27, where the step of applying the DC voltage to the fan motor is done with a voltage regulator.

32. The method of claim 27, where the step of determining the shaft rotation speed of the fan motor is done with a tachometer counting the number of shaft rotation pulses over a given time period.

33. The method of claim 32, further comprising the step of amplifying the plurality of shaft rotation pulses.

\* \* \* \* \*